United States Patent [19]

Martens et al.

[11] Patent Number: 5,229,655
[45] Date of Patent: Jul. 20, 1993

[54] DUAL CONTROL ACTIVE SUPERCONDUCTIVE DEVICES

[75] Inventors: Jon S. Martens, Albuquerque, N. Mex.; James B. Beyer, Madison, Wis.; James E. Nordman, Madison, Wis.; Gert K. G. Hohenwarter, Madison, Wis.

[73] Assignee: Wisconsin Alumni Research Foundation, Madison, Wis.

[21] Appl. No.: 816,395

[22] Filed: Dec. 26, 1991

[51] Int. Cl.[5] .................... H03K 3/38; H03K 17/92; H03K 5/08; H01L 39/22

[52] U.S. Cl. ................................ 307/306; 307/245; 307/541; 257/31

[58] Field of Search .............. 307/306, 245, 541; 357/5

[56] References Cited

U.S. PATENT DOCUMENTS

| | | | |
|---|---|---|---|
| 3,116,427 | 12/1963 | Giaver | 307/245 |
| 3,936,677 | 2/1976 | Fulton et al. | 307/245 |
| 4,157,555 | 6/1979 | Gray | 357/6 |
| 4,334,158 | 6/1982 | Faris | 307/462 |
| 4,458,160 | 7/1984 | Josephs et al. | 307/306 |
| 4,621,203 | 11/1986 | Sweeney | 307/306 |
| 4,764,898 | 8/1988 | Miyahara et al. | 307/306 |
| 4,963,852 | 10/1990 | Drehman | 307/245 |
| 5,019,721 | 5/1991 | Martens et al. | 307/306 |
| 5,109,164 | 4/1992 | Matsui | 307/306 |

OTHER PUBLICATIONS

I. Gaiver, "Magnetic Coupling Between Two Adjacent Type-II Superconductors," Physical Review Letters, vol. 15, No. 21, 22 Nov., 1965, pp. 825-827.

K. K. Likharev, "Vortex Motion and the Josephson Effect in Superconducting Thin Bridges," Soviet Physics JETP, vol. 34, No. 4, Apr. 1972, pp. 906-912.

S. Hontsu, et al., "Fluxon Propagation on a Parallel Array of Microbridge-Type Josephson Junctions," J. Appl. Phys., vol. 63, No. 6, 15 Mar., 1988, pp. 2021-2028.

C. Tsironis, et al., "Microwave Wideband Model of GaAs Dual Gate MESFETs," IEEE Trans. Microwave Theory and Tech., vol. MTT-30, 1982, pp. 243-251.

D. P. McGinnis, et al., "Optimization of Circuit Parameters for the Vortex Flow Transistors," IEEE Trans. Magn., vol. MAG-23, 1987, p. 699.

J. S. Martens, et al., "A Superconducting Single Film Device Oscillator Made of High $T_c$ and Low $T_c$ Materials," Proc. of 1989 IEEE Microwave Theory and Tech. Symposium, Jun. 1989, pp. 443-446.

(List continued on next page.)

Primary Examiner—William L. Sikes
Assistant Examiner—Trong Quang Phan
Attorney, Agent, or Firm—Foley & Lardner

[57] ABSTRACT

A superconducting active device has dual control inputs and is constructed such that the output of the device is effectively a linear mix of the two input signals. The device is formed of a film of superconducting material on a substrate and has two main conduction channels, each of which includes a weak link region. A first control line extends adjacent to the weak link region in the first channel and a second control line extends adjacent to the weak link region in the second channel. The current flowing from the first channel flows through an internal control line which is also adjacent to the weak link region of the second channel. The weak link regions comprise small links of superconductor, separated by voids, through which the current flows in each channel. Current passed through the control lines causes magnetic flux vortices which propagate across the weak link regions and control the resistance of these regions. The output of the device taken across the input to the main channels and the output of the second main channel and the internal control line will constitute essentially a linear mix of the two input signals imposed on the two control lines. The device is especially suited to microwave applications since it has very low input capacitance, and is well suited to being formed of high temperature superconducting materials since all of the structures may be formed coplanar with one another on a substrate.

8 Claims, 5 Drawing Sheets

OTHER PUBLICATIONS

G. K. G. Hohenwarter, et al., "Single Superconducting Thin Film Devices for Applications in High $T_c$ Materials Circuits," IEEE Trans. Magn., vol. MAG-25, Mar. 1989, pp. 954–956.

J. S. Martens, et al., "S Parameter Measurements on Single Superconducting Thin-Film Three-Terminal Devices Made of High-$T_c$ and Low-$T_c$ Materials," J. Appl. Phys., vol. 65, No. 10, 15 May 1989, pp. 4057–4060.

A. M. Kadin, "Duality and Fluxonics in Superconducting Devices," J. Appl. Phys. (to be published).

DUAL CONTROL ACTIVE SUPERCONDUCTIVE DEVICES

This invention was made with U.S. government support awarded by the Department of Energy (DOE) Sandia Subcontract No. 05-7570 and DOD AFOSR Grant No. 89-0052. The U.S. Government has certain rights in this invention.

FIELD OF THE INVENTION

This invention pertains generally to the field of superconductive devices and particularly to active electronic devices which are formed of superconducting materials.

BACKGROUND OF THE INVENTION

The properties of superconductors have made such materials of particular interest for microwave and millimeter wave electronic device applications. The possibility of very low surface resistance is probably the most obvious property which has impacted the development of various types of transmission lines, delay lines, resonators and filters formed of superconducting materials. In addition, the nonlinearities associated with both the quasiparticle superconductor-insulator-superconductor (SIS) tunnel junction, and the associated Josephson junction, have allowed the development of various active devices and circuits such as mixers, detectors, oscillators, phase shifters and parametric amplifiers.

Various types of superconducting electronic devices have been proposed to provide 3-terminal active devices competitive with semiconductor field-effect transistors or bipolar junction transistors. One mechanism that has been exploited to produce thin-film 3-terminal active devices is the flow of flux quanta in the presence of a current, either in a long Josephson junction or in a superconducting film itself. These devices include the junction vortex flow transistor (e.g., T. V. Rajeevakumar, Appl. Phys. Lett. 39, 439 (1981)), and the super CIT (see, e.g., B. J. Van Zeghbroeck, Appl. Phys. Lett. 42, 736 (1983)). Abrikosov vortex flow or superconducting flux flow transistors have also been developed. See G. K. G. Hohenwarter, J. S. Martens, D. P. McGinnis, J. B. Beyer, J. E. Nordman, and D. S. Ginley, "Single Superconducting Thin Film Devices for Applications in High $T_C$ Materials Circuits," IEEE Trans. on Mag. MAG-25, March, 1989, pp. 954-956, and U.S. Pat. No. 5,019,721, to Martens et al. The superconducting flux flow transistor is of particular interest because it can be constructed with present high-temperature superconducting materials and is well-suited to microwave applications since it can be constructed to have very low capacitance.

SUMMARY OF THE INVENTION

A superconducting flux flow device in accordance with the present invention has dual control inputs, and is well-suited to applications such as microwave mixers since the output is proportional to the product of the two inputs. The device may be formed on a planar substrate of a thin film superconductor to provide a device operable in the multiple gigahertz range. Such devices can also be constructed to form oscillators and gain controlled amplifiers.

The device of the invention is formed of superconductors defining two main channels and input control lines for each channel formed coplanar with one another, with no junctions between the input control lines and the electrically isolated main channels. An active weak-link region is interposed in each of the main channels and comprises an array of very small links of superconductor, separated by voids, across which current flows from the input to the output of the main channel. Current passing through the control lines closely adjacent to the active weak-link regions of the main channels produces flux vortices which propagate across the weak-link regions. These flux vortices cause localized areas within the superconducting material of the links to transition to a resistive state, thereby allowing the current flow through the main channel to be controlled by the current flowing through the control line. The two main channels are electrically connected together at their input ends so that bias current divides to flow through the two main channels. However, the current flowing through the first main channel flows to an interval control line adjacent to the weak-link region of the second main conduction channel. The two main channels, the connecting lines between the main channels, and the control lines are all preferably integrally and unitarily formed of a thin-film superconductor, which may be a conventional or a high-temperature superconductor, deposited on a planar substrate. In such a case, the weak link region of the second channel is preferably formed with a somewhat thinner layer of superconducting material so that the second channel reacts more strongly to a change in the current flowing in the interval control line from the first channel. The current flowing through the first channel thus controls the current flowing through the second channel, allowing the gain of the second channel to be controlled by the current flowing through the first control line. Consequently, at the device output taken across both main channels, the output signal from the device will constitute essentially a product of the two input signals imposed on the two control lines.

Further objects, features and advantages of the invention will be apparent from the following detailed description when taken in conjunction with the accompanying drawings.

DETAILED DESCRIPTION OF THE INVENTION

Figures 1, 2:
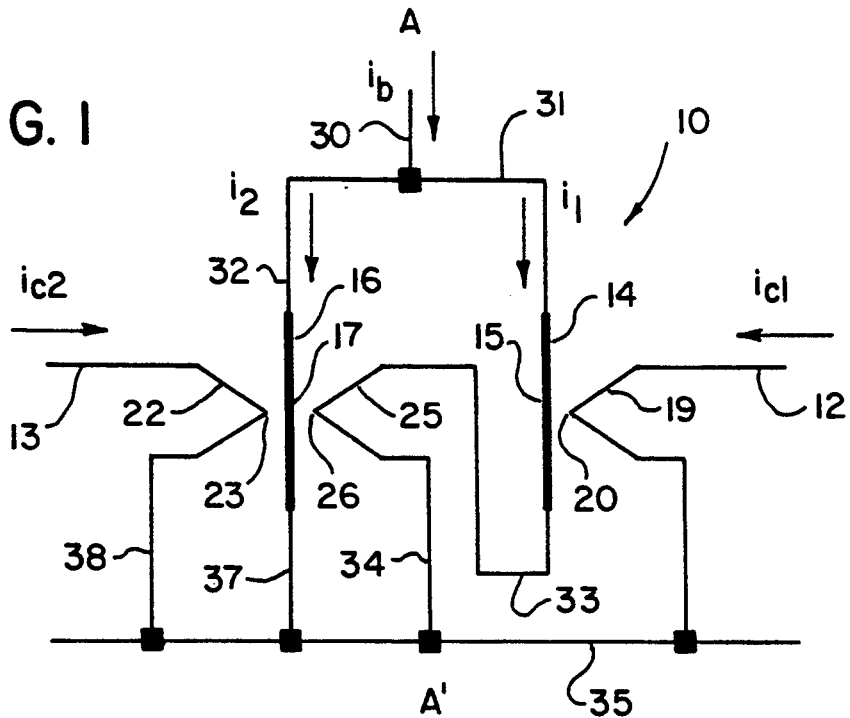
FIG. 1 is a schematic circuit diagram of a dual control active superconducting device in accordance with the present invention.
FIG. 2 is an illustrative view of the thin-film dual active control device in accordance with the invention formed on a planar substrate.

With reference to the drawings, a schematic circuit diagram of a dual control active superconducting device of the present invention is shown generally at 10 in FIG. 1. This device may be used, for example, as a mixer for demodulating a high-frequency signal down to an intermediate frequency. Biasing current is provided across and the output voltage of the device is taken across the points A—A', with the biasing current being denoted as $i_B$. A first input signal current $i_{C1}$ is provided on an input line 12, and a second input signal current $i_{C2}$, to be mixed with the input signal $i_{C1}$ provided on an input line 13. The device 10 includes a first main conduction channel 14 having a weak link region 15, a second main conduction channel 16 having a weak link region 17, a first control line 19 connected to the input line 12 which has a point 20 closely adjacent to the weak link region 15 of the first channel 14, a second control line 22 connected to the input line 13 which has a point 23 closely adjacent to the weak link region 17 of the second channel 16, and an intermediate or internal control line 25 having a point 26 which is also closely adjacent to the weak link region 17 but on the opposite side of the weak link region from the line 23. The main conduction channels 14 and 16, the weak link regions 15 and 17, and the control lines 19, 22 and 25 are preferably formed as described in U.S. Pat. No. 5,019,721, issued May 28, 1991 to Martens et al., the disclosure of which is incorporated herein by reference. These structures thus are preferably formed of thin-film superconducting materials, which may be high temperature superconductors which superconduct at temperatures above liquid helium or hydrogen, on a planar substrate. The device also has a main input line 30, connecting input lines 31 and 32 which extend to the main channels 14 and 16, respectively, a connecting line 33 which connects the main channel 14 to the control line 25, an output conducting line 34 which connects the control line 25 to a main base conductor 35 which may be at ground potential, an output conductor 37 which connects the second main channel 17 to the line 35, and a conductor 38 which connects the control line 22 to the output conducting line 35. Although not necessary, it is preferred that the conductors 30-35 and 37-38 also be formed of superconducting materials deposited on the planar substrate, and preferably are integrally formed with the conduction channels 14 and 16 and the control lines 19, 22 and 25.

When a bias current $i_B$ is provided across the points A—A', the current splits with a current $i_1$ flowing through the main conduction channel 14 and a current $i_2$ flowing through the second main conduction channel 16. The current $i_1$ is controlled by control current $i_{C1}$ passing through the control line 19. However, by virtue of the fact that the current $i_1$ also flows through the control line 25, the current $i_2$ flowing through the second main conduction channel 16 is also controlled by the current $i_1$ flowing through the first main conduction channel as well as the control current $i_{C2}$ flowing through the second control line 22 The effect of control currents in the control lines on the current flowing through the main channels is as described in the aforesaid U.S. Pat. No. 5,019,721. For example, as shown in FIG. 2, the weak link regions 42 and 46 in the first and second main conduction channels, respectively, may be formed of a thin film of superconductor with a series of spaced holes 57 formed in the film in a row, the portions 58 of the superconductor between the holes defining the weak links.

A specific example of a dual control device 39 in accordance with the invention is shown in FIG. 2 formed on a substrate 40. The device 39 of FIG. 2 has a first main conduction channel 41 having a weak link region 42 and a first control line 43 adjacent to the weak link region 42. The device also has a second main conduction channel 45 with a weak link region 46 and a second control line 47 adjacent to the weak link region 46. The input end 48 of the first main conduction channel 41 and the input end 49 of the second main conduction channel 45 were joined together by a conductive bridge 50. Biasing current is provided to the input ends on a conducting line 51, shown schematically in FIG. 2, forming one of the input terminals, A, to the device, and a second connecting line 52 is connected to the output end 53 of the main conduction channel on the other side of the weak link region 46 and forms the other output, A', of the device. Current flowing through the first main conduction channel 41 flows into an internal control line 54 which is closely adjacent to the weak link region 46 in the second main conducting channel 45. The internal control line 54 is connected to an output conductor 55 which is joined by a conducting bridge 56 to the output end 53 of the second main conduction channel 45, which in turn is connected to the output line 52. Thus, bias current provided to the point A will split between the first and second main conduction channels 41 and 45 before flowing out through the second output line 52 to the output port A'. The output voltage of the device is taken across the output points A and A'. Preferably, all of the conductors are formed on the substrate 40 of a superconducting film in the manner described in U.S. Pat. No. 5,019,721.

The interaction of the first conduction channel 41 and the second conduction channel 45 through the internal control line 54 provides feedback which determines the behavior of the overall device, including allowing clean mixing between input signals provided on the control lines 43 and 47, as well as providing the potential to operate the device as an oscillator.

Figure 3:
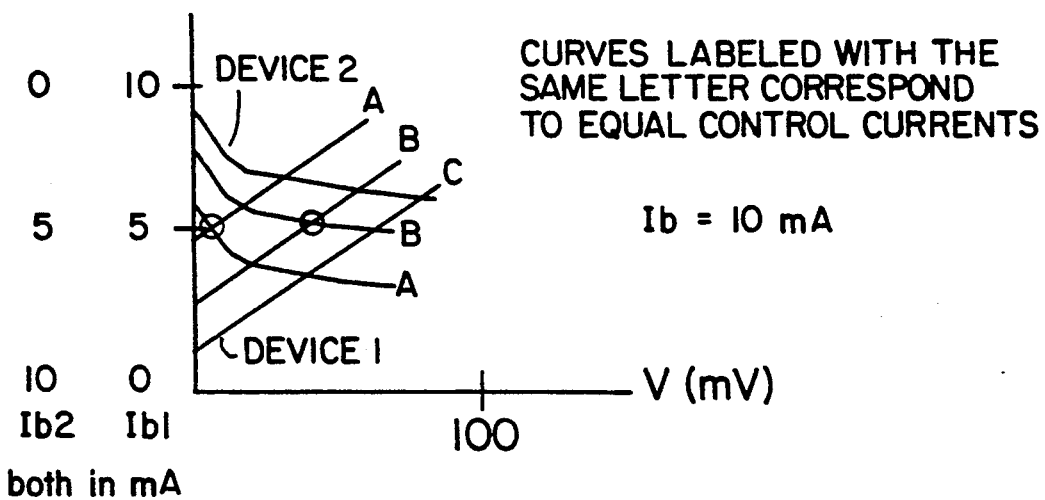
FIG. 3 is a graph showing projected and measured current-voltage curves for the dual control device.
Figure 4:
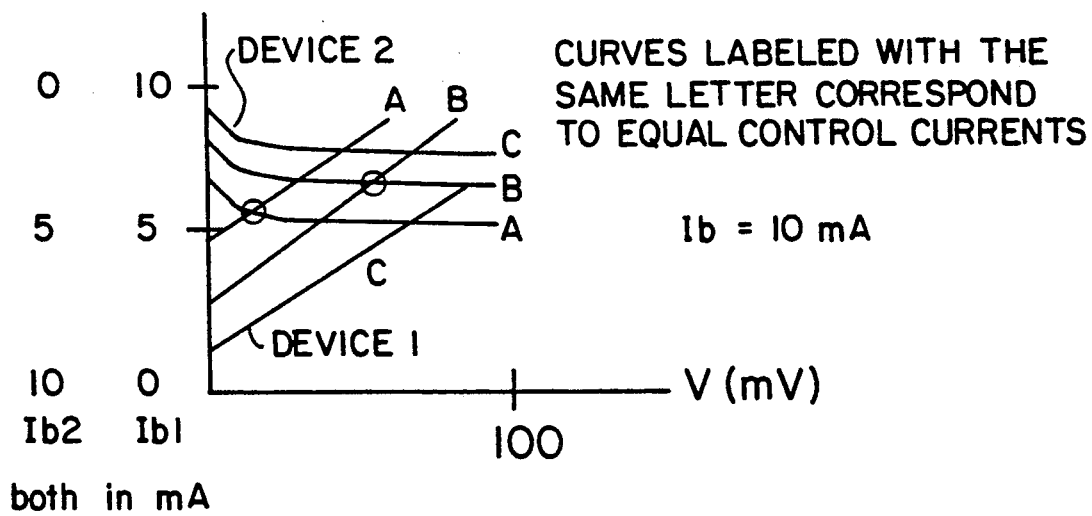
FIG. 4 is a graph showing current-voltage curve overlays for the device of the invention when the weak link regions of the two channels are formed with different characteristics.

The state of the device 39 of FIG. 2 is dependent both on the main body current flowing between the lines 51 and 52 and the net control current through the control lines 43 and 47. As the control signal on the control line 43 changes, the state of the device changes so that the extra control current provided from the control line 54 to the second main conduction channel 45 changes. The composite current-voltage (IV) curves can be generated for the device using the relationship $i_{B1} + i_{B2} = i_B$, where $i_B$ is the total bias current, $i_{B1}$ is the current flowing through the first main conduction channel 41 and $i_{B2}$ is the current flowing through the second main conduction channel 45. A possible bias point occurs where one branch of the characteristic for the first conduction channel meets the branch of the characteristic of the second conduction channel. The feedback provided by the internal control line 54 causes the effective control current on the second main conduction channel 45 to vary with the total bias current. This causes the differences in curvature that are necessary for strong non-linear behavior. Overlays of the IV curves of the two main conduction channels with oppositely running current scales is shown in FIG. 3. The circled points shown in FIG. 3 are two possible bias points. In this example, $i_B = i_{B1} + i_{B2} = 10$ mA for these bias points. The most effective way to cause the IV curves to differ between the two conduction channels, thereby to change the degrees of linearity, is to use different weak link thicknesses for the two channels. That is, the thickness of the film forming the weak link 46 of the channel 45 may be thinner than the film forming the weak links 42 of the main conduction channel 4i. IV curves of an illustrative example of a device having two conduction channels with different weak link thicknesses is shown in FIG. 4. The second main conduction channel may be formed to be "tuned harder" than the first so as to have a different non-linearity than the second channel The circles show some of the possible bias points, again where $i_B = i_{B1} + i_{B2} = 10$ Ma. The second main conduction channel now reacts more strongly to a change in the control current in the control line 43 of the first device This sensitivity is useful in obtaining good mixer performance. It is noted that for given control currents and total bias current, the current splitting between the two main conduction channels is fixed.

To obtain most efficient mixing, it is desirable that the output voltage across the device, the voltage across the ports A and A', be nearly proportional to a product of the two AC control currents on the links 43 and 47. To maximize spectral purity, it is desirable that the output inductance not play a significant role. The output inductance $L_O$ and the output resistance $R_O$ can be kept from maximum values by not carrying out the maximal amount of link tuning. However, by not maximizing the link tuning, the transresistance will not be fully maximized. For good high-temperature superconducting materials at 77 K, this is normally not a problem, and a reduced transresistance $r_M$, for example 12 ohms instead of 18 ohms, which can reduce the output inductance $L_O$ by a factor of two, still yields acceptable performance. As the superconducting films are made thicker in the weak link sections, the effective critical fields increase (the effective penetration depth also decreases) making the system less sensitive, and so $r_M$ decreases. At the same time, the kinetic inductance of the links decrease, which forces the output inductance $L_O$ to also decrease.

Figure 5:
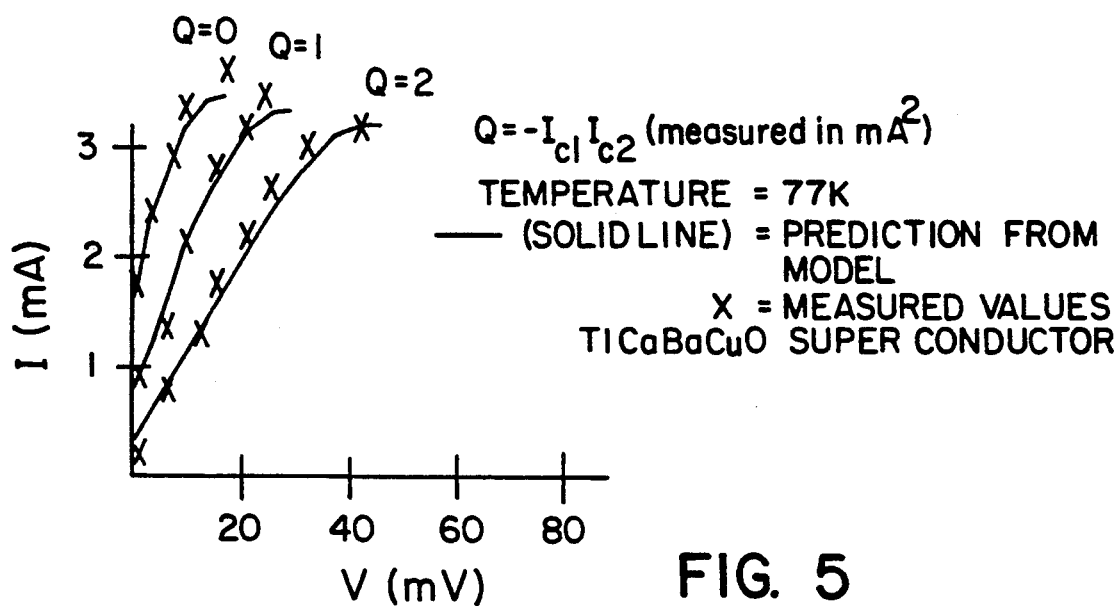
FIG. 5 are graphs showing an overlay of the current-voltage curves of the two channels with current scales which run in the opposite direction.
Figure 6:
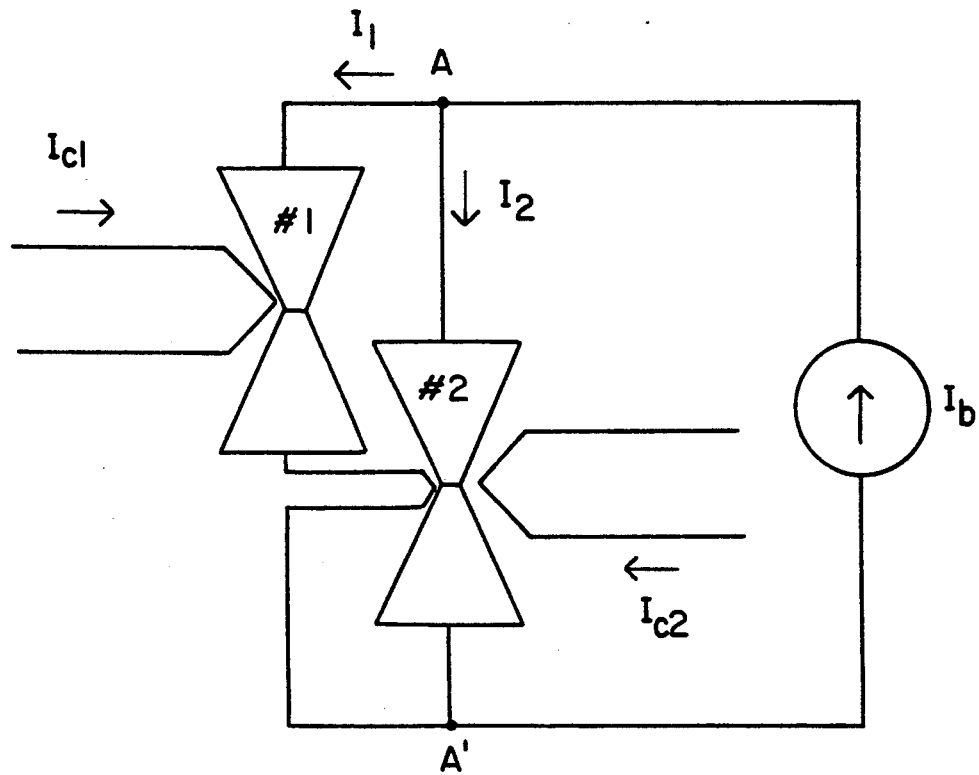
FIG. 6 is a schematic circuit diagram for the device of FIG. 2 illustrating the splitting of the bias current through the two channels of the device.

An IV curve plot for the device of FIG. 2 is shown in FIG. 5, with measured values denoted by "X" marks and arrived at using large signal models for the circuit shown by the solid lines. The material of the circuit was formed of TlCaBaCuO, had 5 links approximately 5 $\mu$m wide by 10 $\mu$m long, separated by 10 $\mu$m, formed of a film about 100 nm thick, and operated at 77 K. It may be noted that for wide variations in control currents, the voltage change depends linearly on the product $i_{C1} \times i_{C2}$. This dependency is desirable for mixing applications. The predicted IV curves are computed utilizing the circuit model of FIG. 6 and the equation:

$$V_1(I_1, I_{C1}) = V_2(I_{BIAS} - I_1, I_1 - I_{C2})$$

where $I_1$ was the current through the first main conduction path, $I_{C1}$ is the control current provided to the control line for the first main conduction channel and $I_{C2}$ is the control current applied to the control line for the second main conduction channel. Note that for the $V_2$ term, $I_1$ forms part of the control current because of the feedback, with the signs of the terms assigned as shown because of the positive reference resulting from the bias current direction.

It can be shown that the terminal voltage V across the device (the voltage across the points A—A') has the form given by the following equation $$V = BPCI_{C1}I_{C2} + (A + BQ)CI_{C1}BPI_{C2} + A + BQ$$

where A, B, C, P and Q are constants which depend on the construction of the device and can be determined experimentally. The foregoing equation demonstrates that apart from a DC component and some leakage signals proportional to the control currents, the output voltage is substantially proportional to the product of the two control currents. This provides the desired mixing behavior for the device. The key to obtaining efficient mixing performance is in the tuning of the construction of the two main channels. To maximize the mixing term with respect to the leakage signal terms, it is desirable to make the constant A large and negative (achieved by using the best material to increase the critical current without changing the flux flow resistances) and to make C large (that is, a large transresistance of the first conducting channel).

Figure 8:
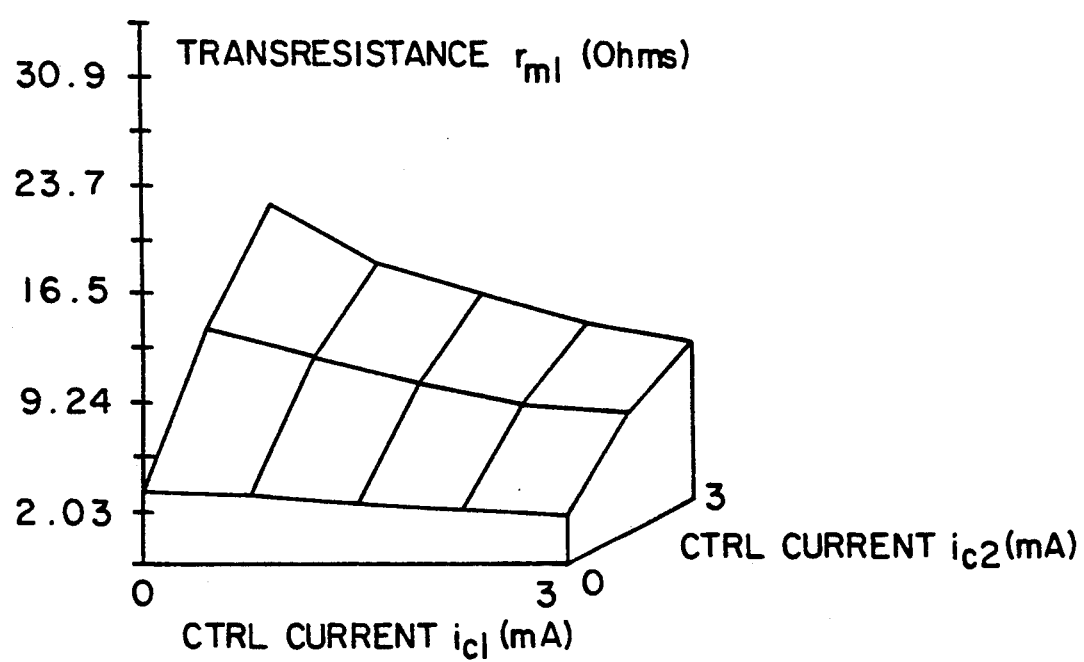
FIG. 8 is an axonometric plot of measured $r_{m1}$ as a function of the two control currents for an exemplary device of the form shown in FIG. 2.
Figure 9:
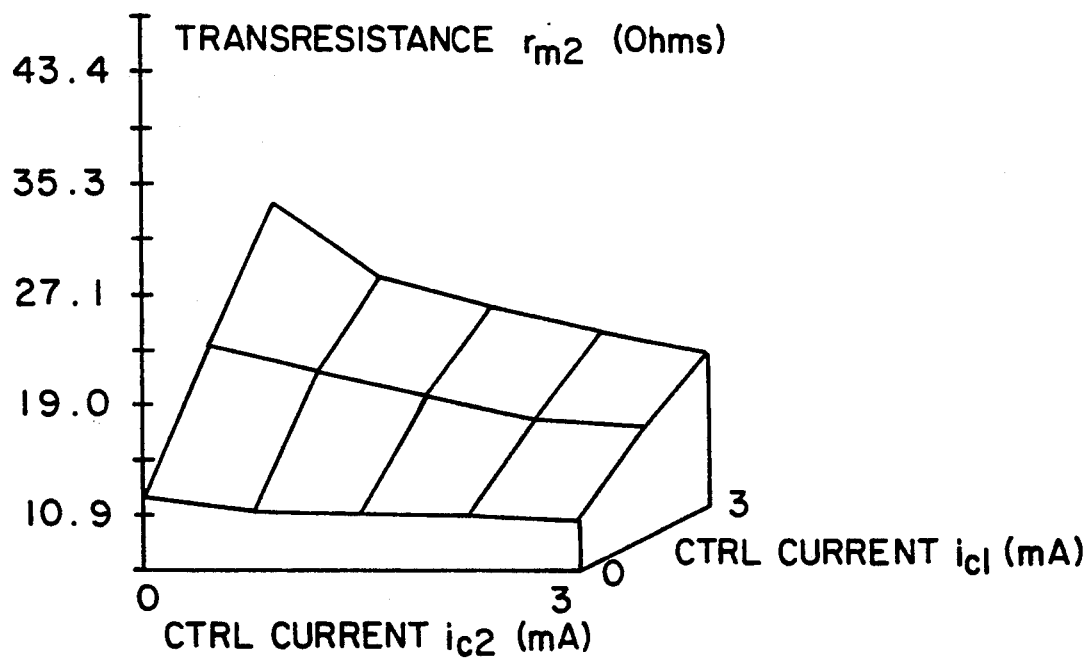
FIG. 9 is an axonometric plot of measured $r_{m2}$ as a function of the two control currents for an exemplary device of the form shown in FIG. 2.

The first main channel effectively acts as a switching device, having more control over the operation of the complete device because of the presence of the feedback path in its channel of the bias drive. It may be noted that the device can be used as a gain-controlled amplifier with the current $i_{C1}$ being used to change the transresistance of the second main channel. This capability is illustrated by the graphs of FIGS. 8 and 9 which are axonometric plots of the transresistances $r_{m1}$, and $r_{m2}$ for the above described device of FIG. 2. For example, from FIG. 8 it is seen that for $i_1$, between 2mA and 3mA, the transresistance $r_{m1}$, can vary nearly an order of magnitude depending on the value of $i_2$.

For mixing purposes, such as demodulation of an input signal, the local oscillator signal at a fairly high drive level is applied as the input current $i_{C1}$ to the first control line and the radio frequency (RF) signal is applied to the second control line as the control current $i_2$.

Figure 7:
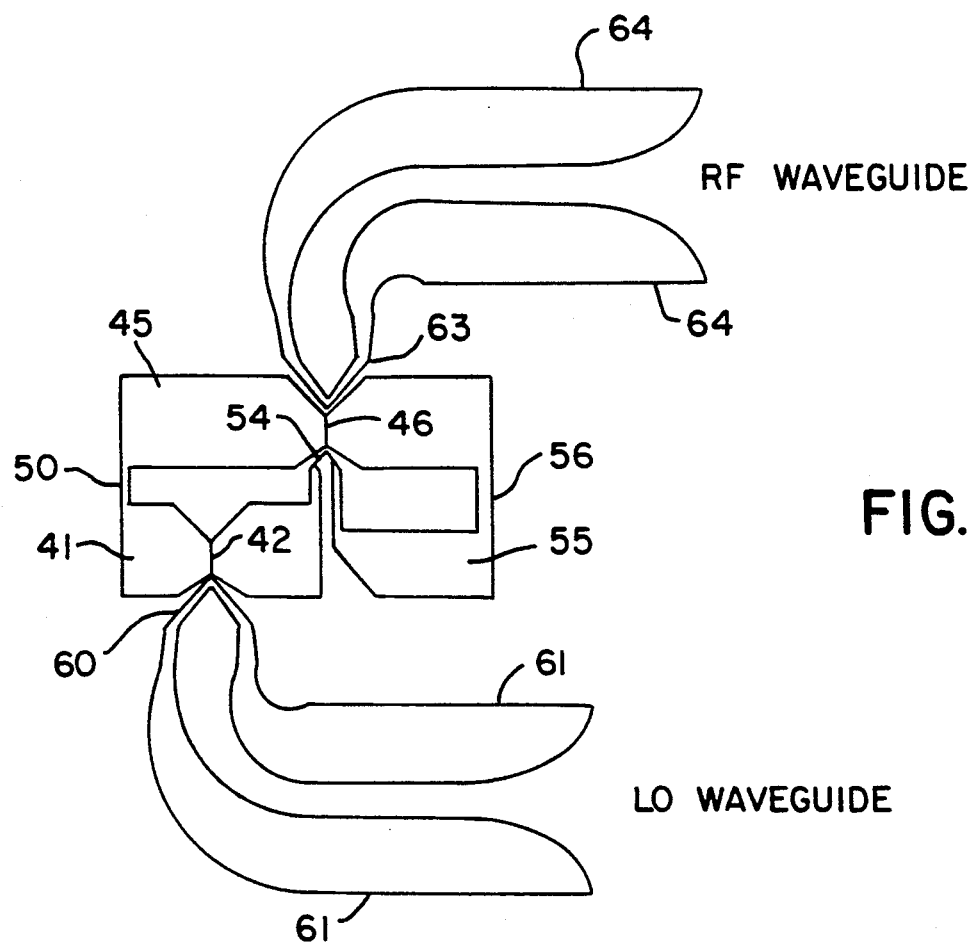
FIG. 7 is an illustrative view of a thin-film dual control device of the invention formed with fin-line transitions for wave guide coupling to provide a Ka band mixer.

A modification of the device of FIG. 2, which is particularly adapted to operate at microwave frequencies, is shown in FIG. 7. The device of FIG. 7 is similar in layout to that of FIG. 2 except it has a first control line 60 having fin-line transition sections 61 for coupling to a wave guide, and a second control line 63 having fin-line sections 64 for coupling to a wave guide. For demodulation purposes, the fin-line transition sections 61 would be coupled to the local oscillator wave guide and the fin-line transition sections 64 are coupled to the RF wave guide. The bias current and intermediate frequency output are taken from the points A and A' in a manner similar to that shown in FIG. 2. The fin-line transition sections 61 and 64 are also preferably formed of thin film superconducting material as are other portions of the devices. Such devices yield a large separation between desired product components and the undesired components, such as leakage terms and undesired mixing terms. The leakage components can be removed by using a pair of mixers in a balanced configuration. Very high frequency unwanted mixer components are reduced in amplitude by the low pass nature of IF circuits, but even the lower frequency spurious signals are heavily attenuated by the mixer. An exemplary device was formed of YBaCuO with three links, each 3 μm wide by 10 μm long by about 100 nm thick, with the links separated by 10 μm. The parallel connected device functions as a down converter, and the device body terminals connect to the IF (intermediate frequency) output. Using an LO of 35 GHz and an IF of 1 GHz, the mixer showed a conversion loss of 7 dB, which was assumed to result from poor coupling. Another exemplary mixer designed for operation from 3 to 5 GHz with more effective coupling was made of TlCaBaCuO and had five links, each 5 μm by 10 μm and approximately 100 μm thick. After compensating for the measurement fixture, the mixer showed a conversion gain of about 5 dB when used with an LO of 4 GHz and an IF of 1 MHz.

The devices of present invention can also be operated as oscillators by providing positive feedback which exceeds the oscillation threshold.

It is understood that the invention is not limited to the particular embodiments set forth herein as illustrative, but embraces such modified forms thereof as come within the scope of the following claims.

What is claimed is:

1. A dual control active superconducting device comprising:
   (a) a first device having a first main conduction channel formed of a film of superconductor on a substrate, an active weak link region interposed in the first main conduction channel, the active weak link region composed of a plurality of links formed of a thin film of superconductor separated by non-superconductive voids, the thickness and lateral dimensions of the links selected such that magnetic flux can propagate across the weak link region when it is superconducting, and a first control line having a portion adjacent to the active weak link region of the first main conduction channel such that current in the first control line will impose a magnetic flux on the weak link region;
   (b) a second superconducting device having a second main conduction channel formed of a film of superconductor on a substrate, an active weak link region interposed in the second main conduction channel, the active weak link region composed of at least one link formed of a thin film of superconductor separated by non-superconductive voids, the thickness and lateral dimensions of the links selected such that magnetic flux can propagate across the weak link region when it is superconducting, and a second control line having a portion adjacent to the active weak link region such that current in the second control line will impose a magnetic flux on the weak link region in the second main conduction channel;
   (c) an internal control line electrically connected to receive the current passed through the first main conduction channel and having a portion adjacent to the active weak link region of the second main conduction channel such that a current in the internal control line will impose a magnetic flux on the weak link region; and
   (d) electrical connectors connected to provide input current to the first and second main conduction channels and to conduct the output current from the second conduction channel after passing through its weak link region and connected to conduct the output current passed from the first conduction channel through the internal control line.

2. The device of claim 1 wherein the first and second main conduction channels, the internal control line, and the conductors providing the current to the first and second main channels and conducting current away from the second channel and the internal control line are integrally formed together of a superconductive thin film on a planar substrate.

3. The device of claim 2 wherein the control lines are formed of thin films of superconductor with the first control line having a point which is adjacent to the weak link region in the first main channel and the second control line having a point which is adjacent to the weak link region in the second channel, wherein the internal control line has a point which is adjacent to the weak link region in the second main conduction channel on the opposite side of the weak link region from the second control line.

4. The device of claim including means for applying a selected biasing current to the first and second main conduction channels when in the superconducting state such that a change in the currents applied to the first and second control lines will result in a change in the voltage across the device between the connection between the first and second main channels providing the input current and the connection between the internal control line and the second main channel which conducts the output current.

5. The device of claim i wherein the thin film forming the weak link region of the second main conduction channel is selected to be thinner than the film forming the weak link region of the first main conduction channel.

6. The device of claim wherein the first and second main conduction channels and the weak link regions therein are formed of a superconductor having a superconducting transition temperature above the temperature of liquid helium or liquid hydrogen.

7. The device of claim 1 wherein the superconductor forming the first and second main conducting channels and the active weak link regions therein is a metallic superconductor.

8. The device of claim wherein the weak link regions in the first and second main conduction channels are formed of thin film of superconductor with a series of spaced holes formed in the film in a row, the portions of the superconductor between the holes defining the weak links.

* * * * *

UNITED STATES PATENT AND TRADEMARK OFFICE
CERTIFICATE OF CORRECTION

PATENT NO. : 5,229,655

DATED : July 20, 1993

INVENTOR(S) : Martens, et al.

It is certified that error appears in the above-identified patent and that said Letters Patent is hereby corrected as shown below:

In column 3, line 68 of the patent, "line 22" should be --line 22.--

In column 4, lines 3 through 9 of the patent, "For example, as shown in FIG. 2, the weak link regions 42 and 46 in the first and second main conduction channels, respectively, may be formed of a thin film of superconductor with a series of spaced holes 57 formed in the film in a row, the portions 58 of the superconductor between the holes defining the weak links." should be deleted.

In column 4, line 42 of the patent, insert --For example, as shown in FIG. 2, the weak link regions 42 and 46 in the first and second main conduction channels, respectively, may be formed of a thin film of superconductor with a series of spaced holes 57 formed in the film in a row, the portions 58 of the superconductor between the holes defining the weak links.--

In column 5, line 13 of the patent, "channel 4i." should be --channel 41-- page 7, line 35.

In column 5, line 18 of the patent, "channel" should be --channel.--

In column 5, line 22 of the patent, "device" should be --device.--

In column 6, line 8 of the patent, "$V=BPCI_{c1}I_{c2}+(A+BQ)CI_{c1}BPI_{c2}+A+BQ$" should be --

$V=BPCI_{c1}I_{c2}+(A+BQ)CI_{c1}+BPI_{c2}+A+BQ$--

UNITED STATES PATENT AND TRADEMARK OFFICE
CERTIFICATE OF CORRECTION

PATENT NO. : 5,229,655
DATED : July 20, 1993
INVENTOR(S) : Martens, et al.

It is certified that error appears in the above-identified patent and that said Letters Patent is hereby corrected as shown below:

In column 6, line 43 of the patent, "$i_2$." should be --$i_{c2}$.--

In column 8, line 28 of the patent, "claim including" should be --claim 1 including--

In column 8, line 39 of the patent, "claim i" should be --claim 1--

In column 8, line 44 of the patent, "claim wherein" should be --claim 1 wherein-- as written in the application on page 14, line 1.

In column 8, line 53 of the patent, "claim wherein" should be --claim 1 wherein--

Signed and Sealed this

Fifth Day of April, 1994

BRUCE LEHMAN

*Attest:*

*Attesting Officer*     *Commissioner of Patents and Trademarks*